United States Patent [19]

Dougherty

[11] Patent Number: 4,654,120

[45] Date of Patent: Mar. 31, 1987

[54] METHOD OF MAKING A PLANAR TRENCH SEMICONDUCTOR STRUCTURE

[75] Inventor: James J. Dougherty, Essex Center, Vt.

[73] Assignee: International Business Machines Corporation, Armonk, N.Y.

[21] Appl. No.: 793,400

[22] Filed: Oct. 31, 1985

[51] Int. Cl.[4] .......................................... H01L 21/308
[52] U.S. Cl. ............................... 156/651; 29/576 W; 29/580; 156/659.1
[58] Field of Search ............ 29/576 W, 580; 156/643, 156/646, 647, 651, 657, 659.1, 662; 204/192 E

[56] References Cited

U.S. PATENT DOCUMENTS

| 4,396,460 | 8/1983 | Tamaki et al. | 156/653 |
| 4,519,128 | 5/1985 | Chesebro et al. | 29/576 |
| 4,545,852 | 10/1985 | Barton | 204/192 E |

OTHER PUBLICATIONS

IBM Technical Disclosure Bulletin, vol. 17, No. 10, Mar. 1975, "Forming Sidewall Dielectric Isolation of Integrated Circuit Devices", by P. M. Schaible et al, pp. 2893-2894.

IBM Technical Disclosure Bulletin, vol. 24, No. 11A, Apr. 1982, "Dielectric Isolation Process", by M. D. Hulvey et al, pp. 5458-5459.

IBM Technical Disclosure Bulletin, vol. 23, No. 11, Apr. 1981, "Prevention of Birdsbeak Formation", by I. Antipov, pp. 4917-4919.

IBM Technical Disclosure Bulletin, vol. 25, No. 11B, Apr. 1983, "Forming Wide Trench Dielectric Isolation", by P. J. Tsang, pp. 6129-6130.

*Primary Examiner*—Ivars Cintins
*Attorney, Agent, or Firm*—Stephen J. Limanek

[57] ABSTRACT

A method is provided for making a planar surface on a semiconductor substrate having a trench or groove formed therein and filled with a material such as an organic material which may be used to electrically isolate one region of the substrate from an adjacent region of the substrate. The method includes the steps of forming a trench or groove in a semiconductor substrate through a surface thereof, depositing an organic or other filling material on the surface of the substrate and into the trench, forming a block of material over the trench on the filling material so as to extend a given distance over the surface of the substrate, etching the filling material with a given etchant so as to remove the filling material disposed over the surface of the substrate until only a segment of the filling material remains over the trench and above the surface of the substrate, forming a layer of material over the surface of the semiconductor substrate so as to cover the segment of the filling material, with the layer of material and the filling material having similar etch rates, and etching simultaneously the layer of material and the segment of the filling material until all of the layer of material is removed from the surface of the semiconductor substrate. In a preferred embodiment of this invention, the filling material is polyimide, the block of material and the layer of material are photoresists and each of the etching steps is carried out with a directional dry etching process using 100% oxygen gas as the etchant.

22 Claims, 4 Drawing Figures

METHOD OF MAKING A PLANAR TRENCH SEMICONDUCTOR STRUCTURE

DESCRIPTION

1. Technical Field

This invention relates to a method of making integrated semiconductor circuit structures and more particularly to a method of making planar semiconductor structures having filled grooves or trenches.

2. Background Art

Grooves or trenches filled with insulating material, such as silicon dioxide or polyimide, for isolating devices, e.g., transistors, from one another, in integrated semiconductor circuits have been known to provide significant device or transistor density improvements over other known isolation techniques such as those employing P-N junctions.

In IBM Technical Disclosure Bulletins, Vol. 17, No. 10, March, 1975, pp. 2893-2894, there is disclosed a V-groove trench filled with polyimide, Vol. 24, No. 11A, April, 1982, pp. 5458-5459, there is disclosed a transistor butted against the sidewall of a trench filled with insulating material, Vol. 23, No. 11, April, 1981, pp. 4917-4919, there is disclosed a trench filled with silicon dioxide and silicon nitride with portions of the silicon nitride being removed by a reactive ion etching (RIE) technique and Vol. 25, No. 11B, April, 1983, pp. 6129-6130, there is disclosed a method for filling a trench with silicon dioxide and planarizing the silicon dioxide with respect to the surface of the substrate in which the trench was formed.

U.S. Pat. No. 4,396,460, filed May 21, 1982, and issued Aug. 2, 1983, discloses a method for obtaining surface flatness at a groove in a semiconductor substrate by employing chemical etching and a double layer film which is made of two different substances.

In commonly assigned U.S. Pat. No 4,519,128, filed on Oct. 5, 1983, by D. G. Chesebro and F. J. Soychak and issued on May 28, 1985, there is disclosed a trench formed in a semiconductor substrate having thin layers of silicon dioxide and silicon nitride formed on the sidewalls and bottom of the trench, with the remainder of the trench filled with polyimide. Any excess polyimide is removed after being thermally cured by known etch back techniques.

It has been found that when the filling material in a trench is etched back an undesired step is formed between the surface of the substrate and the top of the filling material due to either over etching or under etching the filling material and due to the contour of the filling material at the trench. Such a step causes discontinuities in conductive lines or wiring subsequently formed over the substrate which reduces the reliability of these integrated circuits.

DISCLOSURE OF THE INVENTION

It is an object of this invention to provide an improved simple planarization method for semiconductor substrates having narrow grooves or trenches, e.g., less than 2 microns wide, formed therein and filled with, particularly organic material, such as polyimide.

In accordance with the teachings of this invention a method is provided for making a planar surface on a semiconductor substrate having a groove or trench formed therein and filled with a material such as an organic material which may be used to electrically isolate one region of the substrate from an adjacent region. The method includes the steps of forming a groove or trench in a semiconductor substrate through a surface thereof, depositing a filling material, such as an organic material, within the trench and on the surface of the substrate, forming a block of material over the trench on the organic material so as to extend a given distance over the surface of the substrate, etching the organic material and the block with a given etchant so as to remove the block and the organic material disposed over the surface of the substrate, forming a layer of material over the surface of the semiconductor substrate so as to cover the remaining portion of the organic material, with the layer of material and the organic material having similar etch rates with a given etchant and etching the layer of material and the organic material until all of the layer of material is removed.

In a preferred embodiment of this invention, the organic material is polyimide, each of the etching steps is carried out with a dry etching process, the etchant being 100% oxygen gas, the block of material is photoresist and the layer of material is also photoresist.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
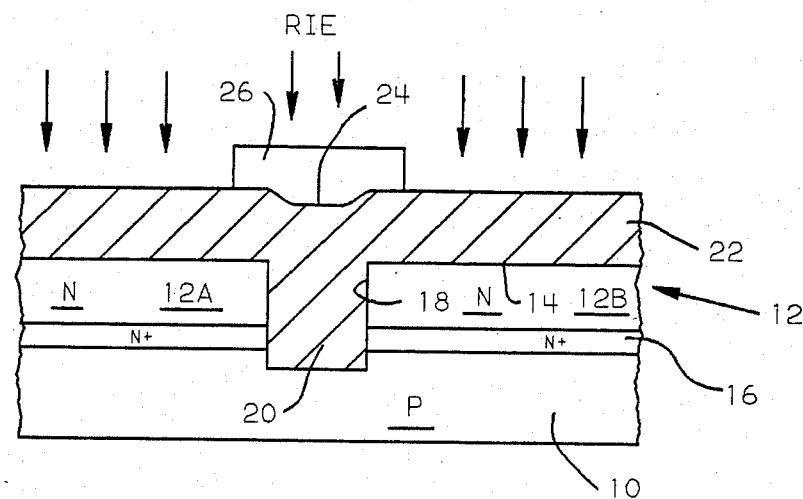
FIGS. 1, 2, 3 and 4 are sectional views of a structure having a trench formed in a semiconductor substrate taken at succeeding stages during the fabrication of the structure made in accordance with the teachings of the present invention.

Referring to the drawings in more detail there is illustrated in sectional view in FIG. 1 a structure which includes a semiconductor substrate 10, preferably made of silicon, having a P type conductivity and an epitaxial layer 12 having a surface 14 and of N type conductivity grown on the substrate 10 by known techniques with an N+ subcollector diffusion region 16 formed at the junction of the substrate 10 and the epitaxial layer 12.

By using an appropriately patterned photoresist mask, with, for example, nitrogen triflouride, not shown, and known reactive ion etching (RIE) techniques, a trench 18, e.g., 2 microns wide, is formed through the epitaxial layer 12 and the N+ subcollector region 16 into the substrate 10 to a depth of approximately 5.0 microns below the surface 14 of the epitaxial layer 12 to form isolated sections 12A and 12B in the epitaxial layer 12. The trench 18 is then filled with polyimide, preferably by depositing a first layer of about 3.5 microns of DuPont 2560 polyimide on the surface of the epitaxial layer 12 and allowing the polyimide to flow into the trench 18 during a spinning operation, curing the first polyimide layer at 80° C. for 13 minutes and then depositing a second layer of about 3.5 microns of DuPont 2560 polyimide over the first polyimide layer and curing the second polyimide layer at 400° C. for 25 minutes. Using reactive ion etching (RIE) techniques with oxygen as the etchant, the cured polyimide, not shown, on the surface 14 of the epitaxial layer 12, is removed with polyimide 20 remaining in the trench 18 to a level somewhat below the surface 14 of the epitaxial layer 12. The trench 18 is then completely filled with DuPont 2560 polyimide until a layer 22 of cured polyimide, about 1.3 microns thick, is formed on the surface 14 of the epitaxial layer 12, as indicated in FIG. 1 of the drawings. After curing the polyimide layer 22, which may have been performed at 400° C. for 25 minutes, a depression or groove 24 is known to form in the cured polyimide layer 22 over the trench 18. It has also been noted that after curing the polyimide, there are variations in the thickness of the polyimide layer 22 over the surface 14 of the epitaxial layer 12. By setting a target thickness of 1.3 microns for the cured polyimide layer 20, it has been found that the lowest point in the depression or groove 24 is located above the surface 14 of the epitaxial layer 12.

Figure 2:
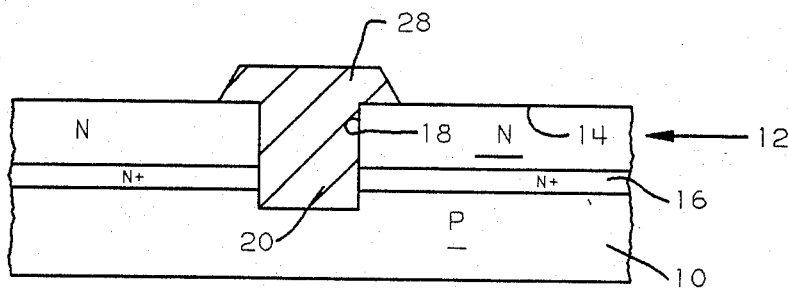

A layer of photoresist, about 2.4 microns thick, is now deposited on the polyimide layer 22 and, with an appropriately patterned mask, a photoresist segment or block 26 is formed over the trench 18 with extensions of the block 26 overlapping the surface 14 of the epitaxial layer 12 adjacent to the trench 18. The photoresist block 26 is made preferably with substantially vertical sidewalls. By again using reactive ion etching (RIE) techniques with oxygen as the etchant, the polyimide layer 22 is removed from the surface 14 of the epitaxial layer 12 except for the polyimide in the vicinity of the trench 18 under the photoresist block 26 where a polyimide segment 28, about 1.3 microns thick, is formed over the trench 18 and on the surface 14 of the epitaxial layer 12 adjacent to the trench 18, as indicated in FIG. 2 of the drawings.

Figure 3:
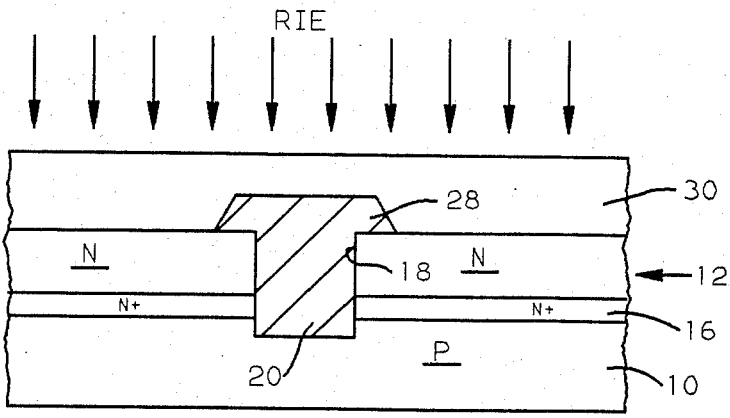
Figure 4:
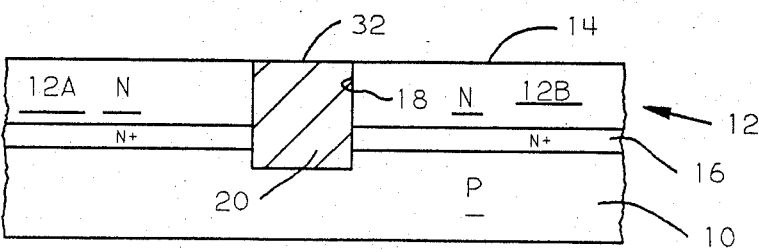

The polyimide segment 28 is then covered with a layer of photoresist 30, as shown in FIG. 3, which may be of the same type as photoresist block 26, having a thickness of about 1.4 microns and having an etch rate similar to that of the polyimide block 28. The layer of photoresist 30 and the polyimide segment 28 are now removed by reactive ion etching (RIE) techniques with oxygen as the etchant to provide a planarized surface wherein it has been found that the upper surface 32 of the polyimide 20, as shown in FIG. 4, in the trench 18 is always less than 0.5 microns above the surface 14 of the epitaxial layer 12 or less than 0.3 microns below the surface 14 of the epitaxial layer 12. Thus, when a conductive line or electrical wiring is extended over the trench 18 between isolated sections 12A and 12B of the epitaxial layer 12, there is little or no likelihood that discontinuities will occur in the line or wire at the surface of the trench 18.

It should be understood that preferred polyimides for filling the groove or trench 18 are those that have a molecular weight greater than approximately 8000 grams/gram-mole. This type of polyimide is desired because the mechanical properties of lower molecular weight polyimides tend to be brittle and result in material defects such as delamination and in-situ fracturing after a trench filling operation. Although these higher molecular weight polyimides tend to produce non-planar surfaces due to the low relative solids content and viscous nature, by the use of the teachings of this invention a process is provided wherein very planar surfaces are repeatedly produced even with the use of polyimides having a molecular weight greater than approximately 8000.

In the preferred embodiment of this invention, polyimide is used as a trench filling material, however, this invention may be practiced by using materials other than polyimide, e.g., glass, given that appropriate reactive ion etching conditions and etchants are used to provide similar etch rates between the photoresist and the glass when reactively ion etching as indicated in FIG. 3 of the drawings.

It should also be noted that the process of this invention may be used advantageously to isolate one semiconductor region from another semiconductor region when making either bipolar transistors in regions 12A and 12B or when making field effect transistors.

Accordingly, it can be seen that this invention provides a very simple process for producing a highly planarized semiconductor structure when one or more trenches are formed in the structure resulting in improved reliability and higher yields for highly dense semiconductor circuits.

While the invention has been particularly shown and described with reference to preferred embodiments thereof, it will be understood by those skilled in the art that various changes in form and details may be made therein without departing from the spirit and scope of the invention.

What is claimed is:

1. A process for making a semiconductor structure which comprises the steps of
    forming a groove in a solid body through a surface thereof,
    depositing a first material into said groove and on said surface,
    forming a block of material over said groove so as to extend a given distance over said surface,
    etching said first material while leaving a segment of said first material under said block,
    forming a layer of second material over the surface of said body so as to cover the segment of said first material, said layer of second material and said first material having similar etch rates, and
    etching simultaneously said layer of second material and said first material until the surface of said body is exposed.

2. A process as set forth in claim 1 wherein said first material is a polyimide.

3. A process as set forth in claim 1 wherein each of said etching steps is a dry etching process.

4. A process as set forth in claim 1 wherein said block is made of a photoresist material.

5. A process as set forth in claim 1 wherein said layer of second material is a photoresist material.

6. A process for making a semiconductor structure which comprises the steps of
    forming a trench in a semiconductor body through a surface thereof,
    depositing an organic material into said trench and on said surface,
    forming a block of material over said trench so as to extend a given distance over said surface,
    etching said organic material with a given etchant so as to remove said organic material deposited over said surface while leaving a segment of said organic material over said trench,
    forming a layer of material over the surface of said semiconductor body so as to cover the remaining portion of said organic material over said trench, said layer of material and said organic material having similar etch rates, and
    etching said layer of material and said organic material until all of said layer of material is removed.

7. A process as set forth in claim 6 wherein said organic material is a polyimide.

8. A process as set forth in claim 6 wherein each of said etching steps is a directional dry etching process.

9. A process as set forth in claim 6 wherein each of said etching steps includes the use of a 100% oxygen gas etchant.

10. A process as set forth in claim 6 wherein said block is made of a photoresist material.

11. A process as set forth in claim 6 wherein said layer of material is a photoresist material.

12. A process for making a semiconductor structure which comprises the steps of
forming a trench in a semiconductor body through a surface thereof,
flowing an organic material having a high molecular weight into said trench and on said surface,
curing said organic material,
forming a block of photoresist over said trench so as to extend a given distance over said surface,
etching said organic material so as to remove said organic material on said surface while leaving a segment of said organic material over said trench,
forming a layer of photoresist over the surface of said semiconductor body so as to cover the segment of said organic material over said trench, said layer of material and said organic material having similar etch rates, and
etching simultaneously said layer of material and said organic material until all of said layer of material is removed.

13. A process as set forth in claim 12 wherein said organic material is a polyimide.

14. A process as set forth in claim 12 wherein each of said etching steps is a directional dry etching process.

15. A process as set forth in claim 12 wherein each of said etching steps includes the use of a 100% oxygen gas etchant.

16. A process for making a semiconductor structure comprising the steps of
growing an epitaxial layer on a semiconductor substrate,
forming an electrically isolating layer at the interface between said epitaxial layer and said substrate,
forming a trench through the surface of said epitaxial layer and said isolating layer into said semiconductor substrate,
flowing an organic material having a high molecular weight into said trench and on the surface of said epitaxial layer,
curing said organic material,
forming a block of material over said trench so as to extend a given distance over the surface of said epitaxial layer, said organic material and said block having similar etch rates for a given etchant,
etching simultaneously said organic material and said block with said given etchant so as to remove said block and said cured organic material on the surface of said epitaxial layer until only a segment of said cured organic material remains over said trench and on the surface of said epitaxial layer adjacent said trench,
flowing a layer of material having a low molecular weight over the surface of said epitaxial layer so as to cover the segment of said cured organic material, said layer of material and said organic material having similar etch rates for said given etchant, and
etching said layer of material and said organic material until the surface of said epitaxial layer is exposed.

17. A process as set forth in claim 16 wherein said organic material is polyimide having a molecular weight greater than 8000 grams/gram-mole.

18. A process as set forth in claim 16 wherein said block and said layer of material are made of photoresist.

19. A process as set forth in claim 16 wherein said forming and etching steps include reactive ion etching.

20. A process for making a semiconductor structure which comprises the steps of
forming a trench in a semiconductor substrate through a surface thereof,
flowing a polyimide having a molecular weight greater than about 8000 grams/gram-mole into said trench and on the surface of said substrate,
curing said polyimide,
forming a block of photoresist on said cured polyimide and over said trench so as to extend a given distance over said surface from said trench, said cured polyimide and said block of photoresist having similar etch rates for a given etchant,
etching simultaneously said cured polyimide and said block until said surface is exposed so as to form a segment of said cured polyimide above the surface of said substrate at said trench,
flowing a layer of photoresist having a low molecular weight compared to that of said polyimide over the surface of said substrate so as to cover said polyimide segment, said layer of photoresist and said polyimide having similar etch rates, and
etching said layer of photoresist and said polyimide until the surface of said substrate is exposed.

21. A process as set forth in claim 20 wherein said forming and etching steps include a directional reactive ion etching process.

22. A process as set forth in claim 20 wherein each of said etching steps includes the use of a 100% oxygen gas etchant.

* * * * *